United States Patent
Park et al.

(10) Patent No.: US 9,818,969 B2
(45) Date of Patent: Nov. 14, 2017

(54) ORGANIC LIGHT EMITTING DIODE DISPLAY DEVICE AND METHOD OF MANUFACTURING THE SAME

(71) Applicant: SAMSUNG DISPLAY CO., LTD., Yongin, Gyeonggi-Do (KR)

(72) Inventors: Kyung Hoon Park, Suwon-si (KR); Sun Park, Suwon-si (KR); Chun Gi You, Asan-si (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 206 days.

(21) Appl. No.: 14/802,487

(22) Filed: Jul. 17, 2015

(65) Prior Publication Data

US 2016/0149154 A1 May 26, 2016

(30) Foreign Application Priority Data

Nov. 21, 2014 (KR) ........................ 10-2014-0163790

(51) Int. Cl.
*H01L 51/52* (2006.01)
*H01L 27/32* (2006.01)

(52) U.S. Cl.
CPC ...... *H01L 51/5209* (2013.01); *H01L 27/3258* (2013.01); *H01L 51/5271* (2013.01)

(58) Field of Classification Search
CPC ............ H01L 27/3246; H01L 51/5253; H01L 51/5271; H01L 2251/5338; H01L 27/3248; H01L 51/5203; H01L 2251/5315; H01L 2227/323; H01L 51/5237; H01L 2251/566
See application file for complete search history.

(56) References Cited

U.S. PATENT DOCUMENTS

| | | | | |
|---|---|---|---|---|
| 2008/0122347 A1* | 5/2008 | Lee | ...................... | H01L 27/3244 313/504 |
| 2014/0151651 A1* | 6/2014 | Jin | ...................... | H01L 51/5209 257/40 |
| 2014/0312319 A1* | 10/2014 | Kim | .................... | H01L 27/3258 257/40 |

FOREIGN PATENT DOCUMENTS

| | | |
|---|---|---|
| KR | 10-2010-0030865 A | 3/2010 |
| KR | 10-2013-0016937 A | 2/2013 |
| KR | 10-2013-0026807 A | 3/2013 |

* cited by examiner

*Primary Examiner* — Eliseo Ramos Feliciano
*Assistant Examiner* — Joannie A Garcia
(74) *Attorney, Agent, or Firm* — Lee & Morse, P.C.

(57) ABSTRACT

An OLED display device includes a driving semiconductor layer on a substrate, a gate insulating layer covering the driving semiconductor layer, a driving gate electrode and etching preventing layer on the gate insulating layer, a passivation layer on the gate insulating layer, driving gate electrode, and etching preventing layer, and including a plurality of protruding and depressed patterns, driving source and drain electrodes on the passivation layer, a pixel electrode on the protruding and depressed pattern, and exposed etching preventing layer, the pixel electrode having a protruding and depressed shape, a pixel definition layer on the passivation layer, and the driving source and drain electrodes, and having a pixel opening exposing the pixel electrode, an organic emission layer on the exposed pixel electrode, and a common electrode on the organic emission layer and pixel definition layer. The protruding and depressed pattern partially exposes the etching preventing layer.

18 Claims, 9 Drawing Sheets

ORGANIC LIGHT EMITTING DIODE DISPLAY DEVICE AND METHOD OF MANUFACTURING THE SAME

CROSS-REFERENCE TO RELATED APPLICATION

Korean Patent Application No. 10-2014-0163790, filed on Nov. 21, 2014, in the Korean Intellectual Property Office, and entitled: "Organic Light Emitting Diode Display Device and Method of Manufacturing the Same," is incorporated by reference herein in its entirety.

BACKGROUND

1. Field

Embodiments relate an organic light emitting diode display device and a manufacturing method thereof.

2. Description of the Related Art

An organic light emitting diode (OLED) display device generally includes two electrodes and an organic emission layer positioned therebetween. In an operation of the organic light emitting diode display device an electron injected from one electrode and a hole injected from the other electrode are coupled with each other in the organic emission layer to generate an exciton, and the exciton emits energy to emit light.

Such an organic light emitting diode display includes a plurality of pixels each including an organic light emitting diode, which is a self-emissive device, and a plurality of transistors for driving the organic light emitting diode and at least one storage capacitor.

SUMMARY

Embodiments are directed to an organic light emitting diode display device, including an insulation substrate, a driving semiconductor layer on the insulation substrate, a gate insulating layer that covers the driving semiconductor layer, a driving gate electrode and an etching preventing layer on the gate insulating layer, a passivation layer on the gate insulating layer, the driving gate electrode, and the etching preventing layer, the passivation layer including a plurality of protruding and depressed patterns, a driving source electrode and a driving drain electrode on the passivation layer, a pixel electrode on the passivation layer, the pixel electrode having a protruding and depressed shape, a pixel definition layer on the passivation layer, the driving source electrode, and the driving drain electrode, the pixel definition layer having a pixel opening that exposes the pixel electrode, an organic emission layer on the exposed pixel electrode, and a common electrode on the organic emission layer and the pixel definition layer. The protruding and depressed pattern partially exposes the etching preventing layer. The pixel electrode is on the protruding and depressed pattern, and the exposed etching preventing layer.

The protruding and depressed pattern may have a thickness that is thinner than that of the passivation layer located at portions other than the etching preventing layer.

The pixel electrode may extend from the driving drain electrode.

The etching preventing layer may be spaced apart from the driving gate electrode, and may be formed of a same material as that of the driving gate electrode.

Each of the driving source electrode, the driving drain electrode, and the pixel electrode may include a lower metal layer and an upper metal layer on the lower metal layer.

The upper metal layer may be made of a reflective metal.

The organic light emitting diode display device may further include a switching semiconductor layer at a same layer as that of the driving semiconductor layer, the switching semiconductor layer being spaced apart from the driving semiconductor layer, a switching gate electrode at a same layer as that of the driving gate electrode, the switching gate electrode being spaced apart from the driving gate electrode, and a switching source electrode and a switching drain electrode at a same layer as that of the driving source electrode, the switching source electrode, the switching drain electrode, and the driving source electrode being spaced apart from each other.

The organic light emitting diode display device may further include a first storage capacitor plate at a same layer as that of the driving gate electrode, the first storage capacitor being connected to the driving gate electrode and the switching drain electrode, and a second storage capacitor plate at a same layer as that of the driving source electrode, the second storage capacitor plate being in an overlapping relationship with the first storage capacitor plate.

Embodiments are also directed to a manufacturing method of an organic light emitting diode display device including forming a buffer layer on an insulation substrate, forming a driving semiconductor layer on the buffer layer, forming a gate insulating layer on the driving semiconductor layer, forming a driving gate electrode and an etching preventing layer on the gate insulating layer, forming a passivation layer on the gate insulating layer, the driving gate electrode, and the etching preventing layer, forming a photosensitive film pattern on the passivation layer, the photosensitive film pattern including a first portion and partially exposing the passivation layer, forming a plurality of protruding and depressed patterns that partially expose the etching preventing layer, and a driving source contact hole and a driving drain contact hole that expose the driving semiconductor layer by etching the passivation layer and the gate insulating layer using the photosensitive film pattern as a mask, forming a driving source electrode, a driving drain electrode, and a pixel electrode having a protruding and depressed shape on the passivation layer, after the photosensitive film pattern is removed, forming a pixel definition layer on the passivation layer, the driving source electrode, and the driving gate electrode, the pixel definition layer having a pixel opening for exposing the pixel electrode, forming an organic emission layer on the pixel electrode, and forming a common electrode on the organic emission layer and the pixel definition layer.

Etching the passivation layer and gate insulating layer may be by a dry etching process.

Forming the protruding and depressed patterns, the driving source contact hole, and the driving drain contact hole may include forming a plurality of preliminary protruding and depressed patterns at a portion corresponding to the etching preventing layer and removing the first portions by partially etching the passivation layer through the dry etching process using of the photosensitive film pattern as a mask, and forming the protruding and depressed patterns by partially etching the preliminary protruding and depressed patterns, and partially exposing the etching preventing layer by etching the passivation layer between the protruding and depressed patterns to form the driving source contact hole and the driving drain contact hole, by continuously performing the dry etching process.

The protruding and depressed pattern may have a thickness that is thinner than that of the passivation layer located at portions other than the etching preventing layer.

The pixel electrode may extend from the driving drain electrode.

The etching preventing layer may be spaced apart from the driving gate electrode, and may be formed of a same material as that of the driving gate electrode.

Each of the driving source electrode, the driving drain electrode, and the pixel electrode may include a lower metal layer and an upper metal layer on the lower metal layer.

The upper metal layer may be made of a reflective metal.

Forming the driving semiconductor layer may include forming a switching semiconductor layer on the buffer layer to be spaced apart from the driving semiconductor layer.

Forming the driving gate electrode and the etching preventing layer may include forming a switching gate electrode to be spaced apart from the driving gate electrode and a first storage capacitor plate to be connected to the driving gate electrode, on the gate insulating layer.

Forming the driving source electrode, the driving drain electrode, and the pixel electrode may include forming a switching source electrode, a switching drain electrode, and a second storage capacitor plate to be spaced apart from each other, on the passivation layer.

The switching drain electrode may be connected to the first storage capacitor plate. The second storage capacitor plate may be in a overlapping relationship with the first storage capacitor plate.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

In the specification, the phrase "in a plan view" indicate when an object portion is viewed from above, and the phrase "in a cross-section" indicates when a cross-section taken by vertically cutting an object portion is viewed from the side.

Figure 1:
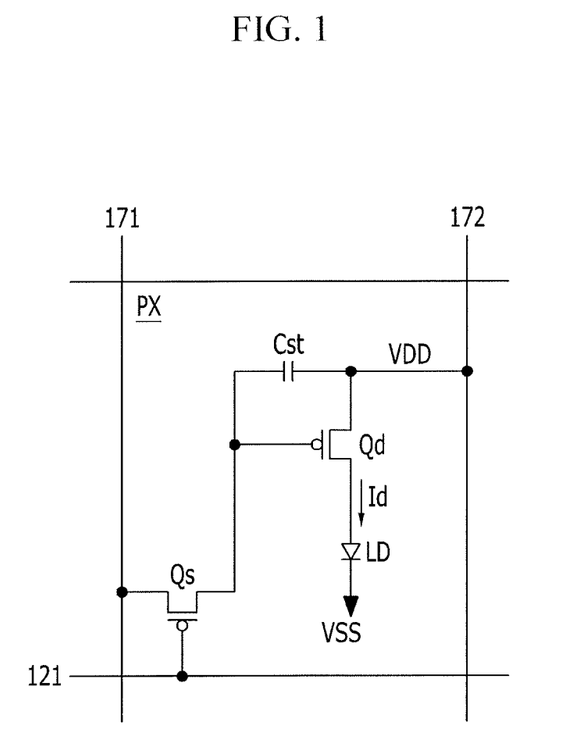
FIG. 1 illustrates an equivalent circuit diagram of one pixel of an organic light emitting diode display device according to an exemplary embodiment.

FIG. 1 illustrates an equivalent circuit diagram of one pixel of an organic light emitting diode display device according to an exemplary embodiment.

Referring to FIG. 1, the organic light emitting display according to the present exemplary embodiment may include a plurality of signal lines 121, 171, and 172, and a plurality of pixels PX respectively connected to the signal lines and substantially arranged in a matrix format.

The signal lines 121, 171, and 172 may include a plurality of gate lines 121 that transmit a gate signal (or a scan signal), a plurality of data lines 171 that transmit a data signal, and a plurality of driving voltage lines 172 that transmit a driving voltage ELVDD. The gate signal and the data signal may be received through a driving driver.

The gate signal lines 121 may be disposed to extend substantially in a row direction and to be substantially parallel to each other. The data lines 171 and the driving voltage lines 172 may be disposed to extend substantially in a column direction and to be substantially parallel to each other.

Each pixel PX may include a switching thin film transistor Qs, a driving thin film transistor Qd, a storage capacitor Cst, and a light emitting device LD.

The switching transistor Qs may include a control terminal, an input terminal, and an output terminal, in which the control terminal is connected to the scanning signal line 121, the input terminal is connected to the data line 171, and the output terminal is connected to the driving transistor Qd. The switching transistor Qs may transmit the data signal received from the data line 171 to the driving transistor Qd in response to the scanning signal received from the scanning signal line 121.

The driving transistor Qd also may include a control terminal, an input terminal, and an output terminal, in which the control terminal is connected to the switching transistor Qs, the input terminal is connected to the driving voltage line 172, and the output terminal is connected to the organic light emitting element LD. The driving transistor Qd may apply an output current ILD the magnitude of which varies according to the voltage applied between the control terminal and the output terminal.

The capacitor Cst may be connected between the control terminal and the input terminal of the driving transistor Qd. The capacitor Cst may store the data signal that is applied to the control terminal of the driving transistor Qd and may maintain the stored data signal even after the switching transistor Qs is turned off.

The organic light emitting element LD may include an anode connected to the output terminal of the driving transistor Qd and a cathode connected to a common voltage Vss. The organic light emitting element LD emits light of which the intensity may be varied according to the output current ILD of the driving transistor Qd, to display an image.

The switching transistor Qs and the driving transistor Qd may be n-channel field effect transistors (FET). In some implementations, at least one of the switching transistor Qs and the driving transistor Qd may be a p-channel FET. The connection relationship among the transistors Qs and Qd, the storage capacitor Cst, and the organic light emitting element LD may vary.

Figure 2:
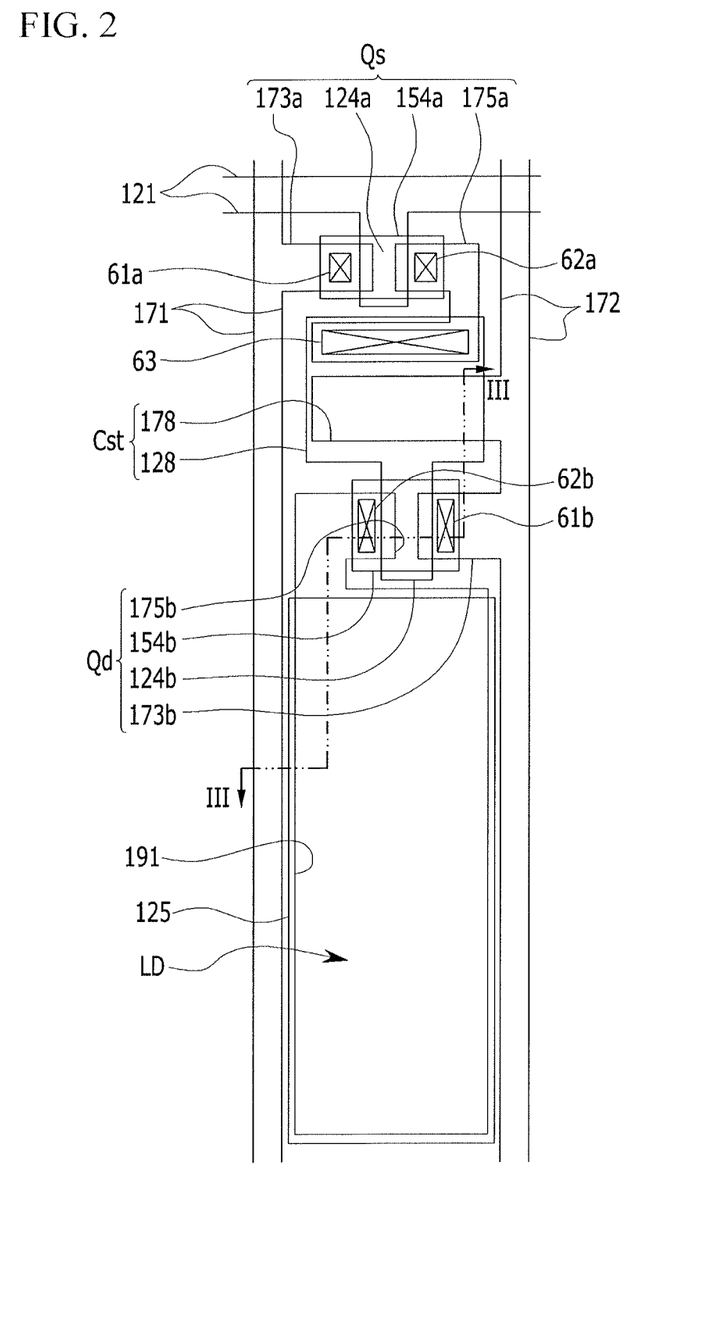
FIG. 2 illustrates a schematic layout view of one pixel of an organic light emitting diode display device according to an exemplary embodiment.
Figure 3:
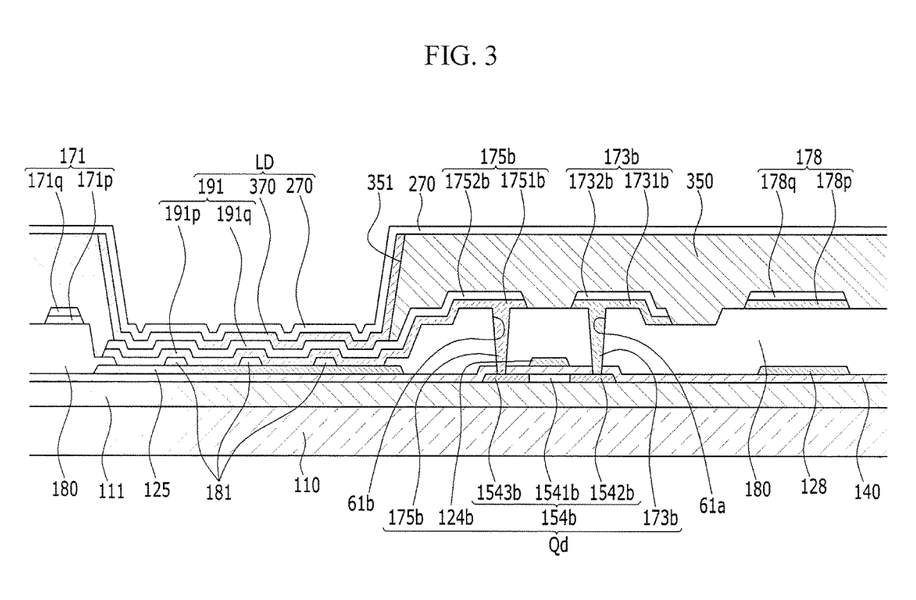
FIG. 3 illustrates a cross-sectional view take along the line of FIG. 2.

FIG. 2 illustrates a schematic layout view of one pixel of an organic light emitting diode display device according to an exemplary embodiment. FIG. 3 is a cross-sectional view take along the line of FIG. 2.

Referring to FIG. 2 and FIG. 3, the organic light emitting diode display device according to the present exemplary embodiment may include a gate line 121, an etching preventing layer 125, a data line 171, a driving voltage line 172, a driving thin film transistor Qs, a switching thin film transistor Qd, a storage capacitor Cst, and an organic light emitting diode LD.

A structure of the switching transistor Qs may be substantially the same as that of the driving transistor Qd. Accordingly, a cross-section of the switching transistor Qs the description of the structure of the switching transistor Qs may be the same or similar to as the cross-section and description of the driving transistor Qd.

A buffer layer 111 may be disposed on an insulation substrate 110. The insulating substrate 110 may be formed of an insulating material such as glass, crystal, ceramic, or plastic. The buffer layer 111 may be formed as a single layer structure of a silicon nitride (SiNx) or as a double layer structure in which a silicon nitride (SiNx) and a silicon oxide (SiOx) are stacked. The buffer layer 111 may serve to flatten the surface while simultaneously preventing unnecessary components such as impurities or water from infiltrating.

A driving semiconductor layer 154b may be disposed on the buffer layer 111. The driving semiconductor layer 154b may be formed of polysilicon, and may include a driving channel region 1541b, a driving source region 1542b, and a driving drain region 1543b. The driving source region 1542b and the driving drain region 1543b may be respectively disposed at opposite sides of the driving channel region 1541b.

Further, a switching semiconductor layer 154a may be disposed on the buffer layer 111 to be spaced apart from the driving semiconductor layer 154b. The switching semiconductor layer 154a may be formed of polysilicon, and may include a switching channel region, a switching source region, and a switching drain region. The switching source region and the switching drain region are respectively disposed at opposite sides of the switching channel region.

The driving channel region 1541b and a switching channel region may be made of polysilicon that is not doped with an impurity, for example, intrinsic semiconductors. The driving source region 1542b, the driving drain region 1543b, a switching source region, and a switching drain region may be made of polysilicon that is doped with an impurity, for example, impurity semiconductors.

A gate insulating layer 140 may be disposed on the buffer layer 111, the driving semiconductor layer 154b, and the switching semiconductor layer 154a. The gate insulating layer 140 may be a single layer or a multilayer including at least one of a silicon nitride and a silicon oxide.

A driving gate electrode 124b, an etching preventing layer 125, and a first storage capacitor plate 128 may be disposed on the gate insulating layer 140. The gate line 121 including a switching gate electrode 124a may be disposed on the gate insulating layer 140. The driving gate electrode 124b, the etching preventing layer 125, the first storage capacitor plate 128, and the gate line 121 may be formed of the same material.

The gate lines 121 may be disposed to extend in a horizontal direction and transmit a gate signal. The switching gate electrode 124a may be disposed to protrude from the gate line 121 toward the switching semiconductor layer 154a, and to overlap the switching semiconductor layer 154a.

The driving gate electrode 124b may be disposed to protrude from the first storage capacitor plate 128 toward the driving semiconductor layer 154b, and to overlap the driving semiconductor layer 154b.

The etching preventing layer 125 may be disposed to be spaced apart from the gate line 121 and the driving gate electrode 124b.

A passivation layer 180 may be disposed on the gate insulating layer 140, the gate line 121, the driving gate electrode 124b, the etching preventing layer 125, and the first storage capacitor plate 128.

The passivation layer 180 may be disposed on the etching preventing layer 125 and may include a plurality of protruding and depressed patterns 181 that partially expose the etching preventing layer 125. The protruding and depressed patterns 181 may have a thickness that is thinner than that of the passivation layer 180 disposed at portions other than the etching preventing layer 125. Such protruding and depressed patterns 181 may be tapered, and the taper angle may be 30 degrees or less. The thickness of the protruding and depressed patterns 181 may be about 3,000 Å. Herein, the term "thickness of the protruding and depressed patterns 181" may refer to the thickness or height of the protruding portion of the protruding and depressed patterns 181. The etching preventing layer 125 may be exposed in the depressed portion of the protruding and depressed patterns 181, and accordingly, the depressed portion may have a thickness of 0.

A driving source contact hole 61b and a driving drain contact hole 62b may be formed in the gate insulating layer 140 and the passivation layer 180 to respectively expose the driving source region 1542b and the driving drain region 1543b. Similarly, a switching source contact hole 61a and a switching drain contact hole 62a may be formed in the gate insulating layer 140 and the passivation layer 180 to respectively expose the switching source region and the switching drain region.

The data line 171, the driving voltage line 172, a driving drain electrode 175b, and a pixel electrode 191 may be disposed on the passivation layer 180. Further, a switching drain electrode 175a may be disposed on the passivation layer 180.

The data line 171 may serve to transfer a data signal. The data line 171 may be disposed to extend in a direction that crosses the gate line 121. Further, the data line 171 may include a switching source electrode 173a that is disposed to protrude in a direction of the switching semiconductor layer 154a.

The driving voltage line 172 may be disposed to be spaced apart from the data line 171, and to extend in the same direction as that of the data line 171. The driving voltage line 172 may include a driving source electrode 173b that is disposed to protrude from the driving voltage line 172 toward the driving semiconductor layer 154b, and a second storage capacitor plate 178 that is disposed to protrude from the driving voltage line 172 and overlap the first storage capacitor plate 128. Herein, the first storage capacitor plate 128 and the second storage capacitor plate 178 may constitute the storage capacitor Cst by employing a dielectric material, for example, the passivation layer 180, therebetween.

The switching drain electrode 175a may be connected to the first storage capacitor plate 128 through a first contact hole 63. As a result, the switching drain electrode 175a may be electrically connected to the first storage capacitor plate 128 and the driving gate electrode 124b. The first contact hole 63 may be formed in the passivation layer 180 and the gate insulating layer 140.

The driving source electrode 173b and the driving drain electrode 175b may be respectively connected to the driving source region 1542b and the driving drain region 1543b through the driving source contact hole 61b and the driving drain contact hole 62b.

The switching source electrode 173a and the switching drain electrode 175a may be respectively connected to the switching source region and the switching drain region through the switching source contact hole 61a and the switching drain contact hole 62a.

The switching semiconductor layer 154a, the switching gate electrode 124a, the switching source electrode 173a, and the switching drain electrode 175a may constitute the switching thin film transistor Qs. The driving semiconductor layer 154b, the driving gate electrode 124b, the driving source electrode 173b, and the driving drain electrode 175b may constitute the driving thin film transistor Qd.

The pixel electrode 191 extending from the driving drain electrode 175b may be disposed on the exposed etching preventing layer 125 and the protruding and depressed patterns 181 of the passivation layer 180. The pixel electrode 191 may have a protruding and depressed shape. The pixel electrode 191 may contact the etching preventing layer 125, for example, in the depressed portion of the protruding and depressed pattern 181.

The data line 171, the driving source electrode 173b, the driving drain electrode 175b, the second storage capacitor plate 178, and the pixel electrode 191 may include lower metal layers 171p, 1731b, 1751b, 178p, and 191p and upper metal layers 171q. 1732b, 1752b, 178q, and 191q that are disposed on the lower metal layers 171p. 1731b, 1751b, 178p, and 191p, respectively.

The upper metal layers 171q, 1732b, 1752b, 178q, and 191q may be made of a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au).

Similarly, the driving voltage line 172, the switching source electrode 173a, and the switching drain electrode 175a may respectively include lower metal layers and upper metal layers disposed on the lower metal layer.

A pixel definition layer 350 having a pixel opening 351 for exposing the pixel electrode 191 may be disposed on the passivation layer 180, the driving source electrode 173b, the driving drain electrode 175b, and the second storage capacitor plate 178. An organic emission layer 370 may be disposed on the pixel electrode 191 exposed through the pixel opening 351. A common electrode 270 may be disposed on the organic emission layer 370 and the pixel definition layer 350. Accordingly, the organic light emitting diode LD including the pixel electrode 191, the organic emission layer 370, and the common electrode 270 may be manufactured.

The common electrode 270 may be made of a transparent conductor such as ITO or IZO for top emission. The pixel electrode 191 may be an anode as a hole injection electrode, and the common electrode 270 may be a cathode as an electron injection electrode. In other implementations, according to a driving method of the organic light emitting diode display device, the pixel electrode 191 may be the cathode and the common electrode 270 may be the anode. The hole and the electron may be injected into the organic emission layer 370 from the pixel electrode 191 and the common electrode 270, respectively, and an exciton generated by coupling the injected hole and electron may fall from an excited state to a ground state to emit light.

As such, since the pixel electrode 191 is disposed on the protruding and depressed patterns 181 of the passivation layer 180, the pixel electrode 191 has the protruding and depressed shape. Accordingly, the emitted light can generate the diffused reflection on protrusions and depressions of the pixel electrode 191, thereby improving the viewing angle.

Further, since the protruding and depressed patterns 181 of the passivation layer 180 have a thickness that is thinner than that of the passivation layer 180 disposed at portions other than the etching preventing layer 125, stepped portions can be reduced by the protruding and depressed patterns 181. Accordingly, it is possible to prevent a short circuit between the pixel electrode 191 and the common electrode 270.

Hereinafter, a manufacturing method of an organic light emitting diode display device according to an exemplary embodiment will be described with reference to FIG. 4 to FIG. 9 and FIG. 3.

FIG. 4 to FIG. 9 illustrate the manufacturing method of the organic light emitting diode display device according to the exemplary embodiment.

As described above, the structure of the switching transistor Qs may be substantially the same as that of the driving transistor Qd. Accordingly the description of the structure of the switching transistor Qs may be substantially the same as that of the driving transistor Qd. A manufacturing method of the switching transistor Qs also may be substantially the same as that of the driving transistor Qd. Similarly, constituent elements disposed at the same layer at which constituent elements of the driving transistor Qd are disposed may be the same as those of the driving transistor Qd.

Figure 4:
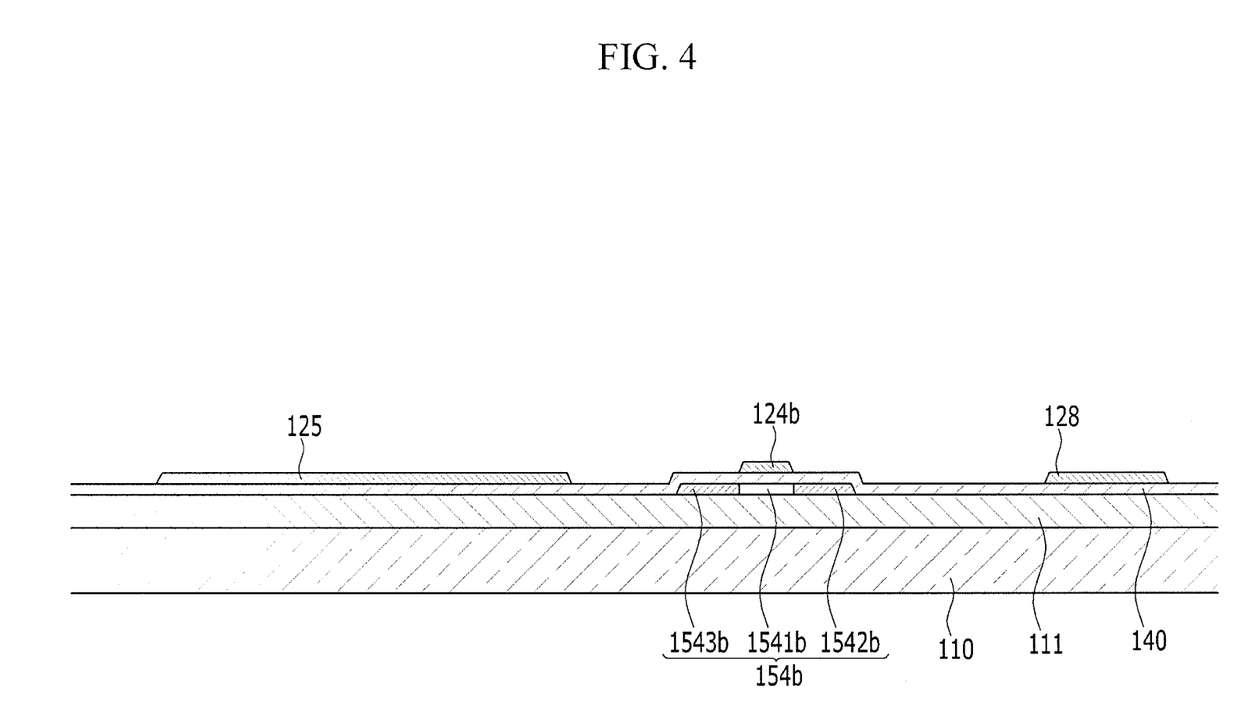
FIG. 4 to FIG. 9 illustrate a manufacturing method of an organic light emitting diode display device according to an exemplary embodiment.

Referring to FIG. 4, the buffer layer 111, the driving semiconductor layer 154b, and the gate insulating layer 140 may be sequentially formed on the insulation substrate 110. The driving gate electrode 124b, the etching preventing layer 125, and the first storage capacitor plate 128 may be formed on the gate insulating layer 140.

The driving semiconductor layer 154b may include the driving channel region 1541b, the driving source region 1542b and the driving drain region 1543b, which may be respectively disposed at opposite sides of the driving channel region 1541b.

The switching semiconductor layer 154a may be formed on the buffer layer 111 to be spaced apart from the driving semiconductor layer 154b. The switching semiconductor layer 154a may include a switching channel region, a switching source region and a switching drain region which are respectively disposed at opposite sides of the switching channel region.

The driving gate electrode 124b may be disposed to protrude from the first storage capacitor plate 128 toward the driving semiconductor layer 154b (see FIG. 2), and to overlap the driving semiconductor layer 154b.

The etching preventing layer 125 may be disposed to be spaced apart from the driving gate electrode 124b.

When the driving gate electrode 124b, the etching preventing layer 125, and the first storage capacitor plate 128 are formed, the gate line 121 including the switching gate electrode 124a may be formed.

Figure 5:
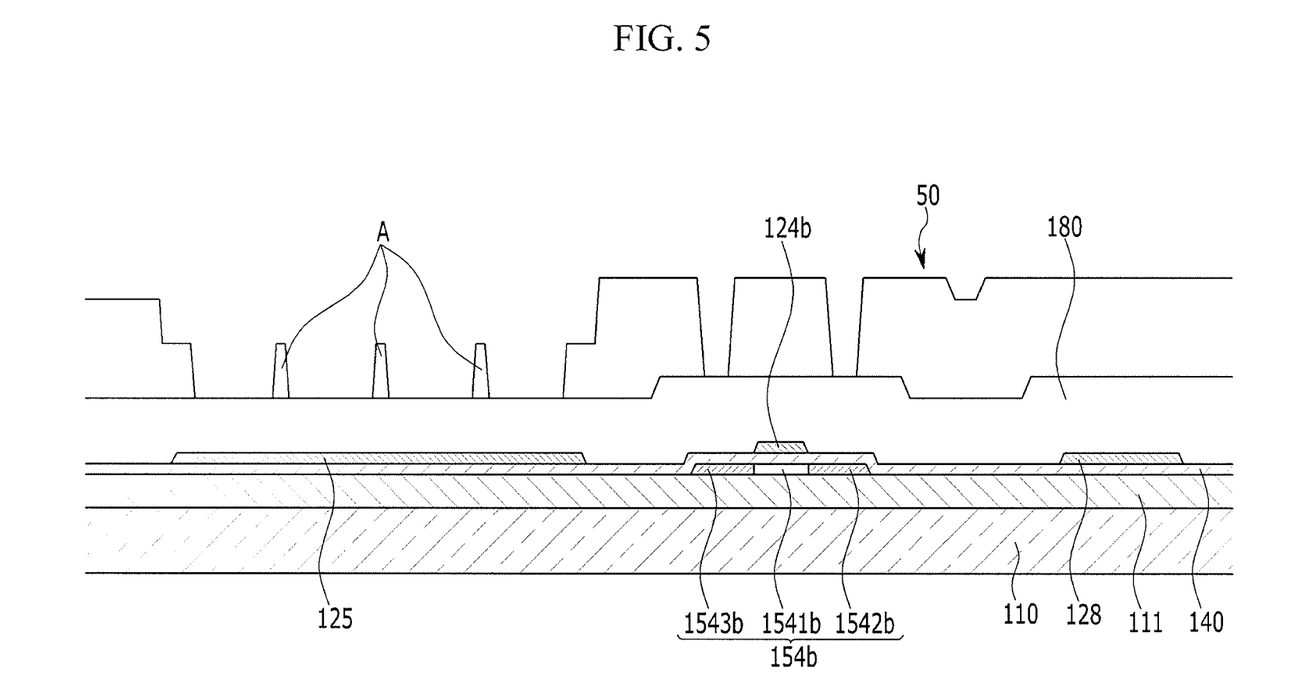

Referring to FIG. 5, the passivation layer 180 may be formed on the gate insulating layer 140, the driving gate electrode 124b, the etching preventing layer 125, and the first storage capacitor plate 128 A first photosensitive film pattern 50 that partially exposes the passivation layer 180 may be formed on the passivation layer 180.

The first photosensitive film pattern 50 may include first portions A that overlap the etching preventing layer 125. The first portions A may be formed of a plurality of patterns Portions of the first photosensitive film pattern 50 other than the first portions A may have a thickness that is thinner than that of the photosensitive film pattern 50.

This photosensitive film pattern 50 may be formed by using a half-tone mask including a light blocking part, a transmissive part, and a transflective part.

Figure 6:
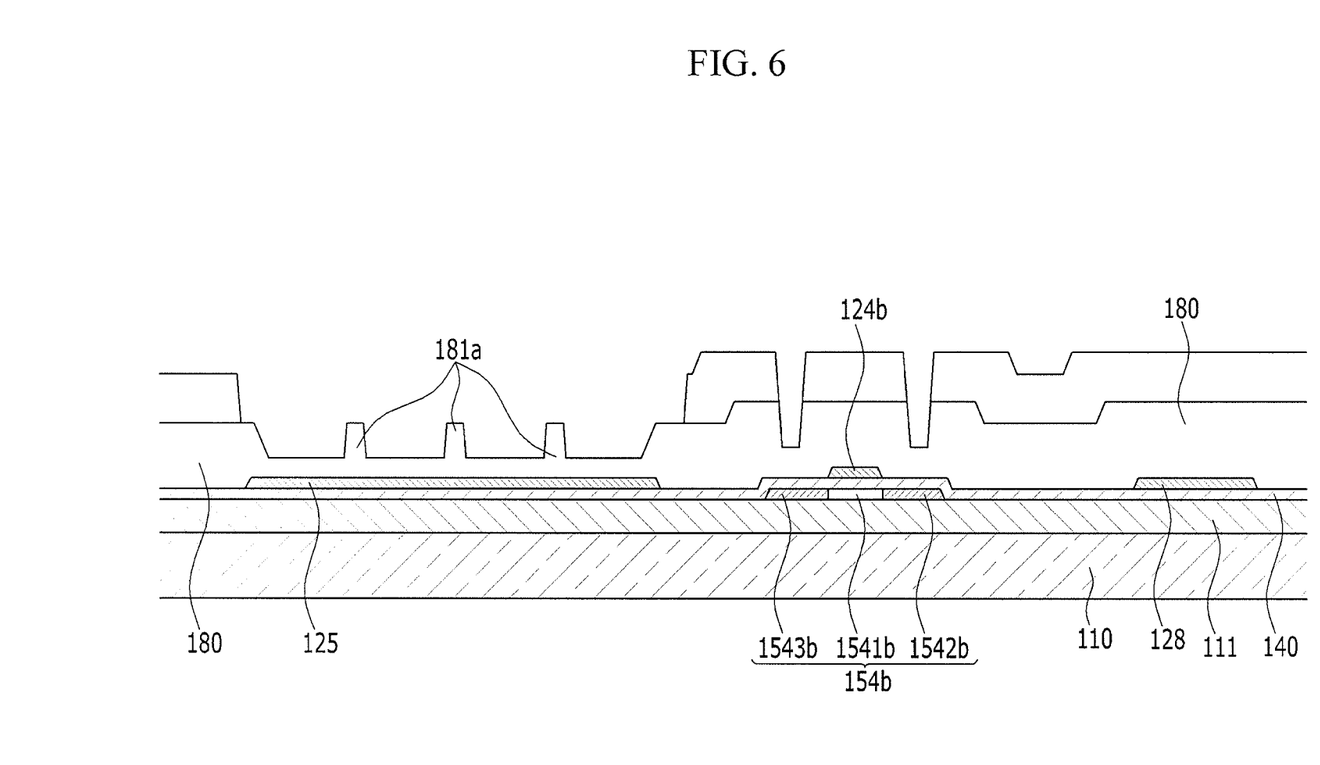
Figure 7:
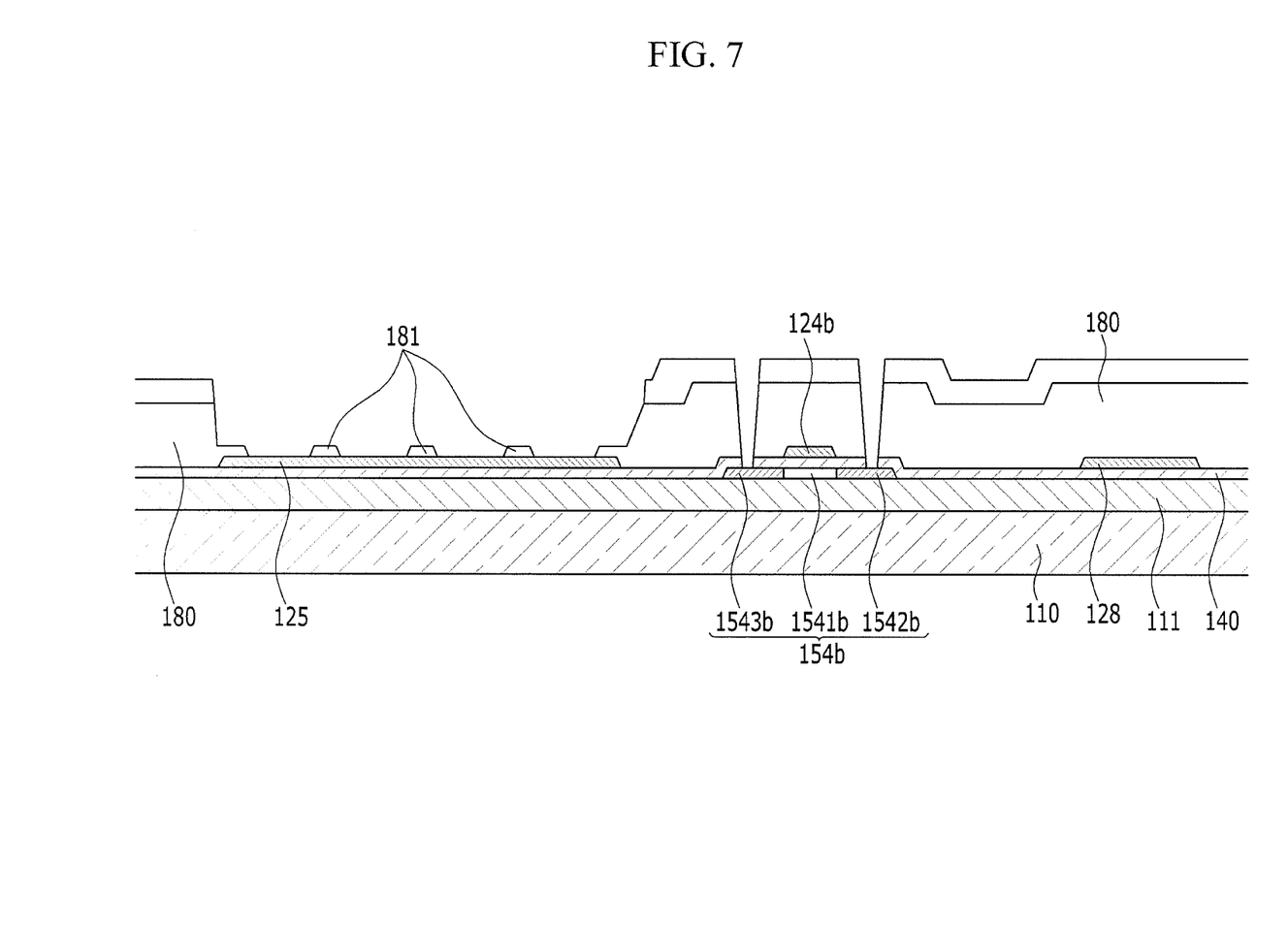

Referring to FIG. 6 and FIG. 7, the passivation layer 180 may be etched by using the photosensitive film pattern 50 as a mask. Herein, for the etching, a dry etching process may be performed.

This dry etching process may partially etch the passivation layer 180 and partially remove the photosensitive film pattern 50. The first portions A may be removed, and the thickness of the photosensitive film pattern 50 may be reduced. The passivation layer 180 may be partially etched such that a plurality of preliminary protruding and depressed patterns 181a are formed at a portion corresponding to the etching preventing layer 125 (see FIG. 6).

Sequentially, the dry etching process may be continuously performed to respectively form the driving source contact hole 61b and the driving drain contact hole 62h to expose the driving source region 1542b and the driving drain region 1543b in the passivation layer 180 and the gate insulating layer 140. The preliminary protruding and depressed patterns 181a may be partially etched to form protruding and depressed patterns 181, and to expose the etching preventing layer 125

In addition, the remaining photosensitive film pattern 50 may be partially etched such that the thickness thereof is reduced (see FIG. 7). The etching preventing layer 125 may serve to prevent the gate insulating layer 140 from being etched, and may serve to make bottom surfaces of the protruding and depressed patterns 181 uniform.

The switching source contact hole 61a and the switching drain contact hole 62a for exposing the switching source region and the switching drain region may be respectively formed in the gate insulating layer 140 and the passivation layer 180.

The protruding and depressed patterns 181 and the passivation layer 180 may be formed together without using an additional mask, thereby reducing a manufacturing cost.

Figure 8:
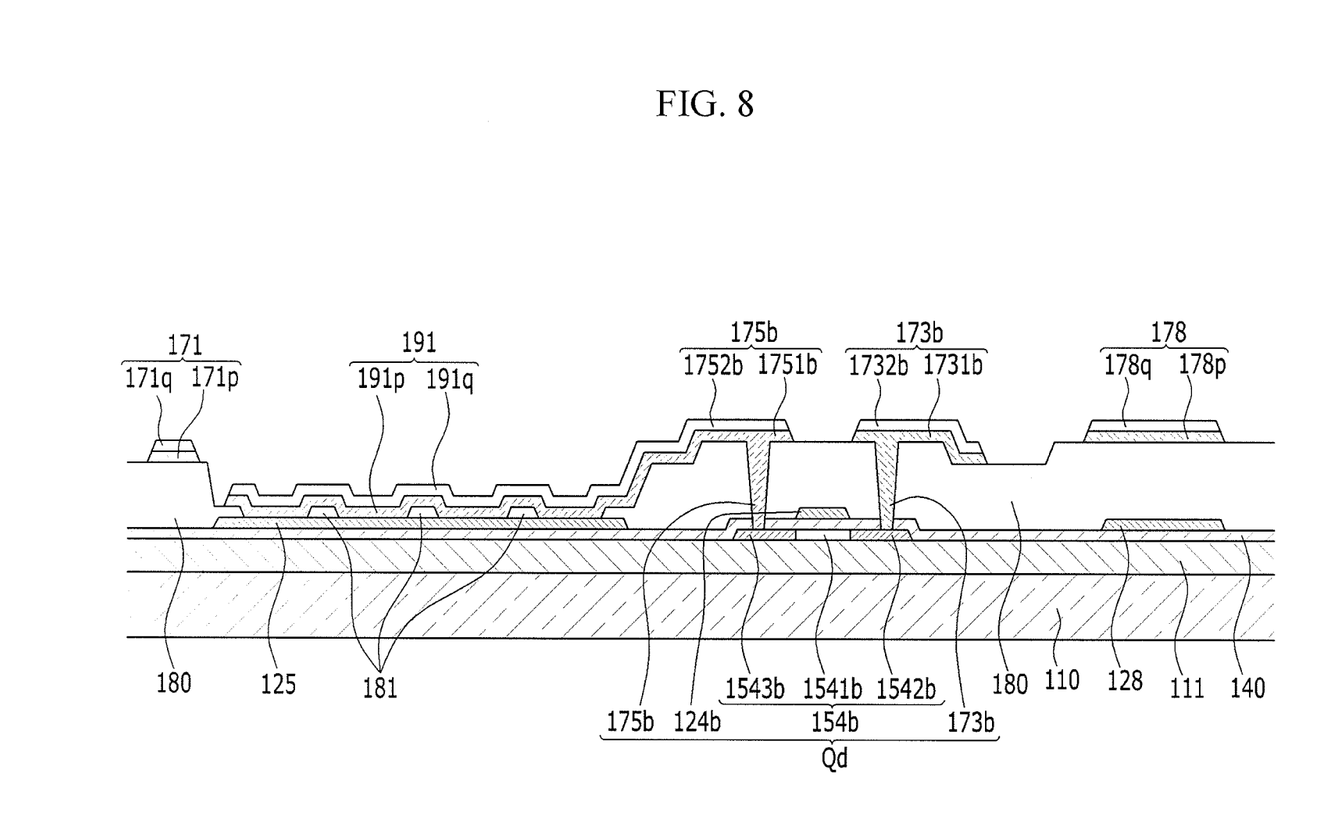

Referring to FIG. 8, after the remaining photosensitive film pattern 50 is removed, the data line 171, the driving source electrode 173b, the driving drain electrode 175b, the second storage capacitor plate 178, and the pixel electrode 191 may be formed on the passivation layer 180. In this case, the driving voltage line 172 and the switching drain electrode 175a may also be formed.

The driving source electrode 173b and the driving drain electrode 175b may be respectively connected to the driving source region 1542b and the driving drain region 1543b through the driving source contact hole 61b and the driving drain contact hole 62b.

The data line 171 may include the switching source electrode 173a that disposed to protrude in the direction of the switching semiconductor layer 154a (see FIG. 1).

The second storage capacitor plate 178 may be disposed to overlap the first storage capacitor plate 128. The first storage capacitor plate 128 and the second storage capacitor plate 178 constitute the storage capacitor Cst by employing a dielectric material.

The pixel electrode 191 may be disposed to extend from the driving drain electrode 175b, and to be formed on the etching preventing layer 125 and the protruding and depressed pattern 181 of the passivation layer 180. Accordingly, the pixel electrode 191 may have the protruding and depressed shape.

The data line 171, the driving source electrode 173b, the driving drain electrode 175b, the second storage capacitor plate 178, and the pixel electrode 191 may respectively include the lower metal layers 171p, 1731b, 1751b, 178p, and 191p, and the upper metal layers 171q, 1732b, 1752b, 178q, and 191q disposed on the lower metal layers 171p, 1731b, 1751b, 178p, and 191p.

The upper metal layers 171q, 1732b, 1752b, 178q, and 191q may be made of a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au).

The driving voltage line 172, the switching source electrode 173a, and the switching drain electrode 175a may respectively include lower metal layers and upper metal layers disposed on the lower metal layers.

As such, the pixel electrode 191 and the data line 171 may be formed together without using an additional mask, thereby reducing a manufacturing cost.

Figure 9:
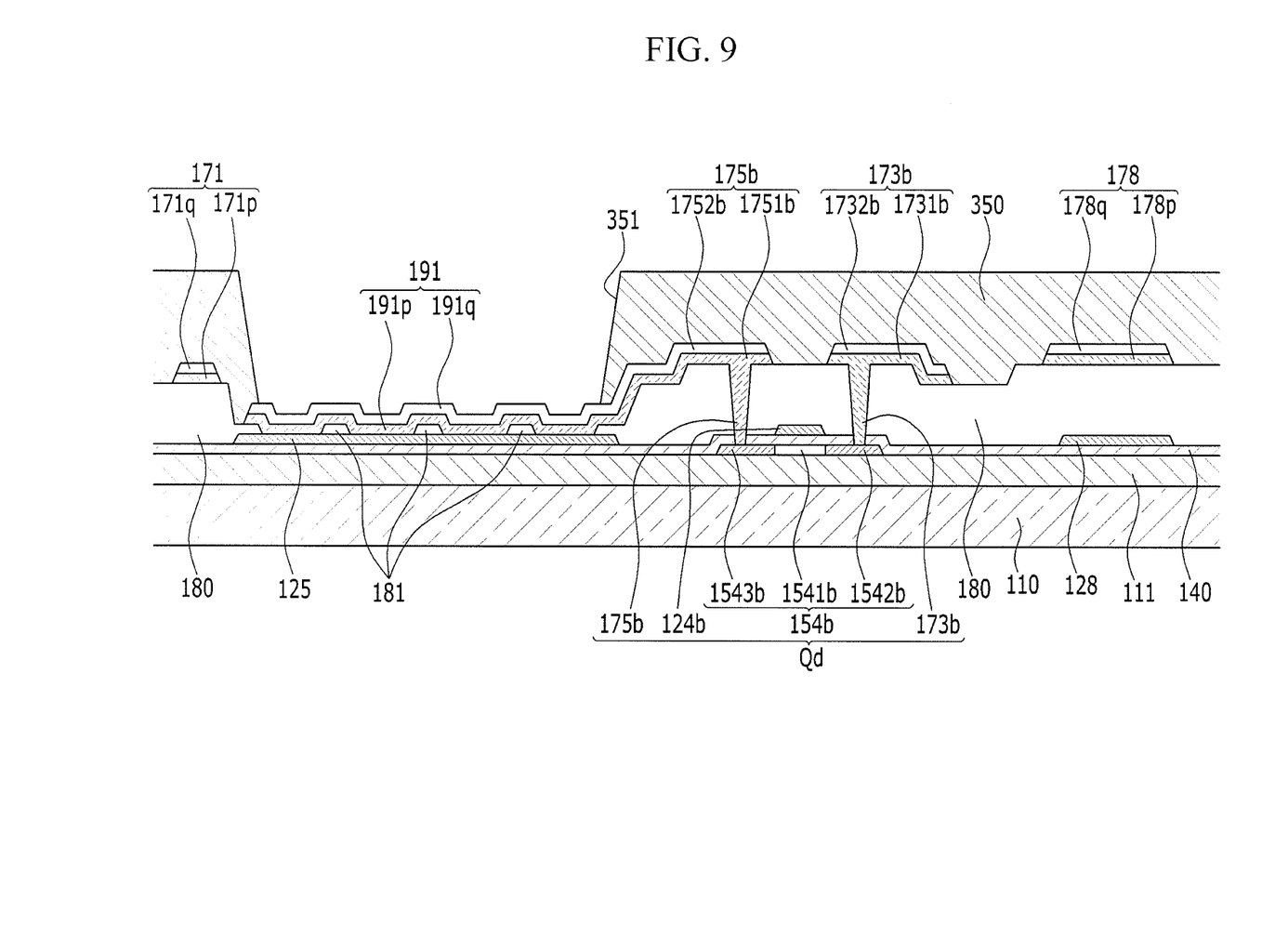

Referring to FIG. 9, the pixel definition layer 350 having the pixel opening 351 for exposing the pixel electrode 191 may be disposed on the passivation layer 180, the driving source electrode 173b, the driving drain electrode 175b, and the second storage capacitor plate 178.

Referring to FIG. 1, the organic emission layer 370 may be disposed on the pixel electrode 191 exposed through the pixel opening 351. The common electrode 270 may be disposed on the organic emission layer 370 and the pixel definition layer 350. Accordingly, the organic light emitting diode LD including the pixel electrode 191, the organic emission layer 370, and the common electrode 270 may be manufactured.

By way of summation and review, an organic light emitting diode display device may include protrusions and depressions on an organic light emitting diode to improve a viewing angle. The protrusions and depressions may be formed by providing a protruding and depressed pattern formed below the organic light emitting diode. However, there is a risk that a common electrode and a pixel electrode constituting the organic light emitting diode may be short-circuited by a thickness of the protruding and depressing pattern.

Embodiments provide an organic light emitting diode display device having advantages of being capable of improving a viewing angle.

According to the embodiments, the passivation layer includes protruding and depressing patterns and the pixel electrode is formed on the protruding and depressing patterns. Accordingly, the pixel electrode has a protruding and depressing shape, thereby improving the viewing angle.

Further, the protruding and depressing patterns are formed to have a thin thickness. Therefore, it is possible to prevent a short circuit between the pixel electrode and the common electrode.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope thereof as set forth in the following claims.

What is claimed is:

1. An organic light emitting diode display device, comprising:

an insulation substrate;
a driving semiconductor layer on the insulation substrate;
a switching semiconductor layer at a same layer as that of the driving semiconductor layer, wherein the switching semiconductor layer is spaced apart from the driving semiconductor layer;
a gate insulating layer that covers the driving semiconductor layer;
a driving gate electrode and an etching preventing layer on the gate insulating layer;
a switching gate electrode at a same layer as that of the driving gate electrode, wherein the switching gate electrode is spaced apart from the driving gate electrode;
a passivation layer on the gate insulating layer, the driving gate electrode, and the etching preventing layer, the passivation layer including a plurality of protruding and depressed patterns;
a driving source electrode and a driving drain electrode on the passivation layer;
a switching source electrode and a switching drain electrode at a same layer as that of the driving source electrode, wherein the switching source electrode, the switching drain electrode, and the driving source electrode are spaced apart from each other;
a pixel electrode on the passivation layer, the pixel electrode having a protruding and depressed shape;
a pixel definition layer on the passivation layer, the driving source electrode, and the driving drain electrode, the pixel definition layer having a pixel opening that exposes the pixel electrode;
an organic emission layer on the exposed pixel electrode; and
a common electrode on the organic emission layer and the pixel definition layer,
wherein the protruding and depressed pattern partially exposes the etching preventing layer, and the pixel electrode is on the protruding and depressed pattern, and the exposed etching preventing layer.

2. The organic light emitting diode display device as claimed in claim 1, wherein the protruding and depressed pattern has a thickness that is thinner than that of the passivation layer located at portions other than the etching preventing layer.

3. The organic light emitting diode display device as claimed in claim 2, wherein the pixel electrode extends from the driving drain electrode.

4. The organic light emitting diode display device as claimed in claim 3, wherein the etching preventing layer is spaced apart from the driving gate electrode, and is formed of a same material as that of the driving gate electrode.

5. The organic light emitting diode display device as claimed in claim 1, wherein each of the driving source electrode, the driving drain electrode, and the pixel electrode includes a lower metal layer and an upper metal layer on the lower metal layer.

6. The organic light emitting diode display device as claimed in claim 5, wherein the upper metal layer is made of a reflective metal.

7. The organic light emitting diode display device as claimed in claim 1, further comprising:
a first storage capacitor plate at a same layer as that of the driving gate electrode, the first storage capacitor being connected to the driving gate electrode and the switching drain electrode, and
a second storage capacitor plate at a same layer as that of the driving source electrode, the second storage capacitor plate being in an overlapping relationship with the first storage capacitor plate.

8. A manufacturing method of an organic light emitting diode display device, the method comprising:
forming a buffer layer on an insulation substrate;
forming a driving semiconductor layer on the buffer layer;
forming a gate insulating layer on the driving semiconductor layer;
forming a driving gate electrode and an etching preventing layer on the gate insulating layer, wherein forming the driving gate electrode and the etching preventing layer includes forming a switching gate electrode to be spaced apart from the driving gate electrode and a first storage capacitor plate to be connected to the driving gate electrode, on the gate insulating layer;
forming a passivation layer on the gate insulating layer, the driving gate electrode, and the etching preventing layer;
forming a photosensitive film pattern on the passivation layer, the photosensitive film pattern including a first portion and partially exposing the passivation layer;
forming a plurality of protruding and depressed patterns that partially expose the etching preventing layer, and a driving source contact hole and a driving drain contact hole that expose the driving semiconductor layer by etching the passivation layer and the gate insulating layer using the photosensitive film pattern as a mask;
forming a driving source electrode, a driving drain electrode, and a pixel electrode having a protruding and depressed shape on the passivation layer, after the photosensitive film pattern is removed;
forming a pixel definition layer on the passivation layer, the driving source electrode, and the driving gate electrode, the pixel definition layer having a pixel opening for exposing the pixel electrode;
forming an organic emission layer on the pixel electrode; and
forming a common electrode on the organic emission layer and the pixel definition layer.

9. The manufacturing method as claimed in claim 8, wherein etching the passivation layer and gate insulating layer is by a dry etching process.

10. The manufacturing method as claimed in claim 9, wherein forming the protruding and depressed patterns, the driving source contact hole, and the driving drain contact hole includes:
forming a plurality of preliminary protruding and depressed patterns at a portion corresponding to the etching preventing layer and removing the first portions by partially etching the passivation layer through the dry etching process using of the photosensitive film pattern as a mask, and
forming the protruding and depressed patterns by partially etching the preliminary protruding and depressed patterns, and partially exposing the etching preventing layer by etching the passivation layer between the protruding and depressed patterns to form the driving source contact hole and the driving drain contact hole, by continuously performing the dry etching process.

11. The manufacturing method as claimed in claim 10, wherein the protruding and depressed pattern has a thickness that is thinner than that of the passivation layer located at portions other than the etching preventing layer.

12. The manufacturing method as claimed in claim 11, wherein the pixel electrode extends from the driving drain electrode.

13. The manufacturing method as claimed in claim 12, wherein the etching preventing layer is spaced apart from the driving gate electrode, and is formed of a same material as that of the driving gate electrode.

14. The manufacturing method as claimed in claim 8, wherein each of the driving source electrode, the driving drain electrode, and the pixel electrode includes a lower metal layer and an upper metal layer on the lower metal layer.

15. The manufacturing method as claimed in claim 14, wherein the upper metal layer is made of a reflective metal.

16. The manufacturing method as claimed in claim 8, wherein forming the driving semiconductor layer includes forming a switching semiconductor layer on the buffer layer to be spaced apart from the driving semiconductor layer.

17. The manufacturing method as claimed in claim 8, wherein forming the driving source electrode, the driving drain electrode, and the pixel electrode includes forming a switching source electrode, a switching drain electrode, and a second storage capacitor plate to be spaced apart from each other, on the passivation layer.

18. The manufacturing method as claimed in claim 17, wherein:
   the switching drain electrode is connected to the first storage capacitor plate, and
   the second storage capacitor plate is in a overlapping relationship with the first storage capacitor plate.

* * * * *